United States Patent
Na

(10) Patent No.: US 7,384,272 B2
(45) Date of Patent: Jun. 10, 2008

(54) FLEXIBLE PRINTED CIRCUIT BOARD ASSEMBLY, METHOD FOR MANUFACTURING THE SAME, AND PORTABLE TERMINAL COMPRISING THE SAME

(75) Inventor: Sang-Ju Na, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/477,937

(22) Filed: Jun. 30, 2006

(65) Prior Publication Data

US 2007/0000126 A1     Jan. 4, 2007

(30) Foreign Application Priority Data

Jul. 4, 2005    (KR) .................... 10-2005-0059688

(51) Int. Cl.
*H05K 1/10*     (2006.01)

(52) U.S. Cl. ...................................................... 439/67

(58) Field of Classification Search ............ 439/67–79
See application file for complete search history.

(56) References Cited

U.S. PATENT DOCUMENTS 4,416,497 A * 11/1983 Brandsness et al. ........ 439/492
5,616,050 A * 4/1997 Suski ......................... 439/495
6,483,713 B2 * 11/2002 Samant et al. ................ 439/67

* cited by examiner

*Primary Examiner*—Briggitte R. Hammond
(74) *Attorney, Agent, or Firm*—Birch, Stewart, Kolasch & Birch, LLP

(57) ABSTRACT

The present invention relates to a flexible printed circuit board assembly. A flexible printed circuit board assembly of the present invention comprises a flexible printed circuit board having a plurality of circuit patterns; a connector mounted at a location spaced apart by a certain distance from an end of the flexible printed circuit board and electrically connected to the, circuit patterns; and a stiffener attached to a region on a bottom surface of the flexible printed circuit board below the connector and having a size corresponding to that of the connector. A connector inside portion and a connector outside portion of the flexible printed circuit board located inside and outside with respect to the connector can be bent. The connector outside portion is bent and bonded to a bottom surface of the stiffener, and the connector inside portion is bent and bonded to a bottom surface of the connector outside portion.

11 Claims, 6 Drawing Sheets

FLEXIBLE PRINTED CIRCUIT BOARD ASSEMBLY, METHOD FOR MANUFACTURING THE SAME, AND PORTABLE TERMINAL COMPRISING THE SAME

BACKGROUND OF THE INVENTION

1. Field of the Invention

The present invention relates to a flexible printed circuit board assembly, and more particularly, to a flexible printed circuit board assembly, which has a complicated circuit pattern and a connector but can be easily mounted even in a relatively narrow space.

2. Description of the Related Art

Since a flexible printed circuit board assembly has flexibility by which the flexible printed circuit board assembly can be bent by itself, the flexible printed circuit board assembly has been used in various kinds of electrical appliances. For example, a flexible printed circuit board can be installed between a main body and an openable display unit of a notebook computer to transmit an electrical signal between the main body and the display unit, or can be installed between a main body and a movable pickup assembly of an optical disc drive in a computer to transmit a signal therebetween.

Further, the flexible printed circuit board is used in a portable terminal such as a cellular phone or a personal digital assistant (PDA) that a user utilizes to perform communication or to store information while conveniently carrying it with him/her. The cellular phone or PDA comprises a min body containing a signal transmitting/receiving means and a signal processing means; and a display unit that can be opened or closed with respect to the main body. In general, the display unit is slid or folded with respect to the main body so that the display unit can be opened or closed. In such a cellular phone or PDA, since the display unit is opened or closed with respect to the main body, transmission/reception of a signal between the main body and the display unit is performed through the flexible printed circuit board.

Generally, a number of circuit patterns corresponding to a variety of functions of the portable terminal are formed on the flexible printed circuit board. A connector is mounted on the flexible printed circuit board, so that the flexible printed circuit board can be electrically connected through the connector to a main printed circuit board (PCB) of the main body or a PCB contained in the display unit.

There is a recent tendency for a portable terminal to have a variety of additional functions such as the functions of a camera and an MP3 player in addition to a basic communication function. Such diversification of functions inevitably results in complication of printed patterns of a flexible printed circuit board to support transmission and reception of signals corresponding the various functions. The complication of the printed patterns of the flexible printed circuit board means that the area of the flexible printed circuit board becomes larger and the connector inevitably has a large size corresponding thereto.

Referring to FIGS. 1 and 2, the conventional flexible printed circuit board assembly comprises a flexible printed circuit board 1 provided with a plurality of circuit patterns 3 printed thereon at certain intervals, and a connector 2 provided at one side of the flexible printed circuit board 1.

As described above, as the functions of the portable terminal become complicated, various circuit patterns printed on the flexible printed circuit board become more complicated and the number thereof is increased, leading to increase in the required area of the flexible printed circuit board 1 and increase in the size of the connector 2. Further, a plurality of terminals 4 to be electrically connected to the circuit patterns 3 are provided on a bottom surface of the connector 2.

The connector 2 is provided at a location spaced apart by a certain distance L from an end of the flexible printed circuit board 1 and can be connected, for example, to a connector of a portable terminal so as to transmit an electrical signal. The mounting of the connector 2 at the location spaced apart by the distance L from the end of the flexible printed circuit board 1 is because it is necessary to secure an area on which circuit patterns to be connected to terminals 4 placed at an end portion of the connector 2 will be formed. That is, as denoted by reference numeral "A" in FIG. 1, a predetermined area should be provided between the connector 2 and the flexible printed circuit board 1 so as to form the circuit patterns to be connected to the terminals 4 provided at the end portion of the connector.

A stiffener 5 is attached to a bottom surface of the flexible printed circuit board 1, which is a surface opposite to the surface on which the connector 2 is provided. The stiffener 5 is provided to prevent the flexible printed circuit board 1 from being deformed under an atmosphere at a high temperature in the process of connecting the patterns of the flexible printed circuit board 1 to the terminals 4 of the connector 2. The stiffener is made of a synthetic resin material or a metallic material and then attached to the bottom surface of the flexible printed circuit board 1. Moreover, the stiffener 5 is provided to protect and stably support the flexible printed circuit board when the connector of a main body of the portable terminal is connected to or detached from the connector 2. To stably support the flexible printed circuit board 1 as described above, the conventional stiffener 5 is designed to have a width W that is twice as large as the distance from the end of the flexible printed circuit board 1 to the connector 2, as shown in FIG. 2.

However, there is a recent tendency for a personal terminal such as a cellular phone or a PDA to be smaller and slimmer. With the tendency of diversification of functions due to addition of the functions of an MP3 player, a camera including a moving picture, and the like, the number of circuit patterns for transmitting signals increases accordingly. For example, since a PDA has relatively more functions than a cellular phone, the PDA has one hundred or more circuit patterns for transmitting signals, and a connector having one hundred or more terminals or pins corresponding to the circuit patterns.

With the increase in the number of circuit patterns and the size of a connector due to diversification of the functions of a portable terminal, there is limitation on reduction of the size and thickness of the portable terminal. That is, when the circuit patterns to be connected to the connector 2 are designed and arranged in the conventional structure of the portable terminal, there is limitation in that an area including portion "A" around the connector inevitably becomes larger. For example, due to increase in the number of circuit patterns, the size of the connector 2 as well as the distance L between the connector 2 and the end of the flexible printed circuit board are increased inevitably. Accordingly, the entire size of the flexible printed circuit board assembly becomes larger, and thus, there is limitation on miniaturization and slimness of the portable terminal.

SUMMARY OF THE INVENTION

The present invention is conceived to solve the aforementioned problems. A primary object of the present invention is to provide a flexible printed circuit board assembly, which can be installed in a minimum space upon installation thereof in a device such as a portable terminal, in spite of complicated circuit patterns and a large connector due to diversification of functions of the device.

This object means that in spite of increase in the size of a flexible printed circuit board assembly due to diversification of functions of a device such as a portable terminal, a compact device can be implemented when the flexible printed circuit board assembly of the present invention is applied.

According to an aspect of the present invention for achieving the object, there is provided a flexible printed circuit board assembly, comprising a flexible printed circuit board having a plurality of circuit patterns; a connector mounted at a location spaced apart by a certain distance from an end of the flexible printed circuit board and electrically connected to the circuit patterns; and a stiffener attached to a region on a bottom surface of the flexible printed circuit board below the connector and having a size corresponding to that of the connector, wherein a connector inside portion and a connector outside portion of the flexible printed circuit board located inside and outside with respect to the connector can be bent.

The connector outside portion and/or the connector inside portion preferably are/is bent downward and bonded to a bottom surface of the stiffener. In an embodiment, the connector outside portion is bent and bonded to a bottom surface of the stiffener, and the connector inside portion is bent and bonded to a bottom surface of the connector outside portion.

The connector outside portion and/or the connector outside portion may be bonded by means of an adhesive or a double-sided tape.

The stiffener may be formed of a non-conductive synthetic resin material.

In another embodiment of the present invention, the stiffener has a bottom surface provided with a downward extending hook, and the connector outside portion and the connector outside portion are provided with fastening holes so that the hook can be fastened to the holes after the connector outside portion and the connector outside portion are bent downward. Here, the connector outside portion and the connector inside portion are placed below the stiffener by fastening the hook to the fastening holes.

According to another aspect of the present invention, there is provided a flexible printed circuit board assembly, comprising a flexible printed circuit board having a plurality of circuit patterns; a connector mounted at a location spaced apart by a certain distance from an end of the flexible printed circuit board and electrically connected to the circuit patterns; and a stiffener attached to a region on a bottom surface of the flexible printed circuit board below the connector and having a size corresponding to that of the connector, wherein a connector outside portion of the flexible printed circuit board located outside with respect to the connector is bent downward so that an end of the connector outside portion is maintained below the stiffener, and a connector inside portion of the flexible printed circuit board located inside with respect to the connector is bent downward so that at least a part of the connector inside portion overlaps with the connector outside portion.

According to a further aspect of the present invention, there is provided a portable terminal, comprising a main body portion having a control unit for processing a signal; a display unit opened or closed with respect to the main body portion; and a flexible printed circuit board assembly for connecting the control unit of the main body portion to the display unit. The flexible printed circuit board assembly includes a flexible printed circuit board having a plurality of circuit patterns; a connector mounted at a location spaced apart by a certain distance from an end of the flexible printed circuit board and electrically connected to the circuit patterns; and a stiffener attached to a region on a bottom surface of the flexible printed circuit board below the connector and having a size corresponding to that of the connector, wherein a connector inside portion and a connector outside portion of the flexible printed circuit board located inside and outside with respect to the connector are bent toward below the connector so as to electrically connect the main body portion to the display unit.

Even in the portable terminal, the connector inside portion and the connector outside portion of the flexible printed circuit board are preferably bent such that they at least partially overlap with each other. For example, the connector outside portion is bent and bonded to a bottom surface of the stiffener, and the connector inside portion is bent and bonded to a bottom surface of the connector outside portion.

In another embodiment, the stiffener has a bottom surface provided with a downward extending hook, and the connector outside portion and the connector outside portion are provided with fastening holes so that the hook can be fastened to the holes after the connector outside portion and the connector outside portion are bent downward. Thus, the connector outside portion and the connector outside portion can be maintained in the bent state below the stiffener by means of the hook.

According to a still further aspect of the present invention, there is provided a method for manufacturing a flexible printed circuit board assembly, comprising the steps of forming a plurality of circuit patterns on a flexible printed circuit board; mounting a connector in a region on the flexible printed circuit board; electrically connecting the circuit patterns to the connector; attaching a stiffener to a region on a bottom surface of the flexible printed circuit board corresponding to the connector; bending downward a connector outside portion of the flexible printed circuit board located outside with respect to the connector, and fixing the connector outside portion to a bottom surface of the stiffener; and bending downward a connector inside portion of the flexible printed circuit board located inside with respect to the connector, and fixing the connector inside portion to a bottom surface of the connector outside portion.

The connector inside portion or the connector outside portion is preferably fixed by means of bonding.

According to the present invention, in the flexible printed circuit board assembly, both the portions of the flexible printed circuit board located outside and inside with respect to the connector in a longitudinal direction of the flexible printed circuit board can be bent. Accordingly, once both the portions of the flexible printed circuit board are bent downward and bonded to the stiffener, the entire volume of the flexible printed circuit board assembly is reduced. Thus, there is an advantage in that the flexible printed circuit board assembly can be mounted in a relatively small space in spite of complication of circuit patterns due to diversification of functions of a device and resultant increase in the size of the connector.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Hereinafter, preferred embodiments of the present invention will be described in detail with reference to the accompanying drawings.

Figure 1:
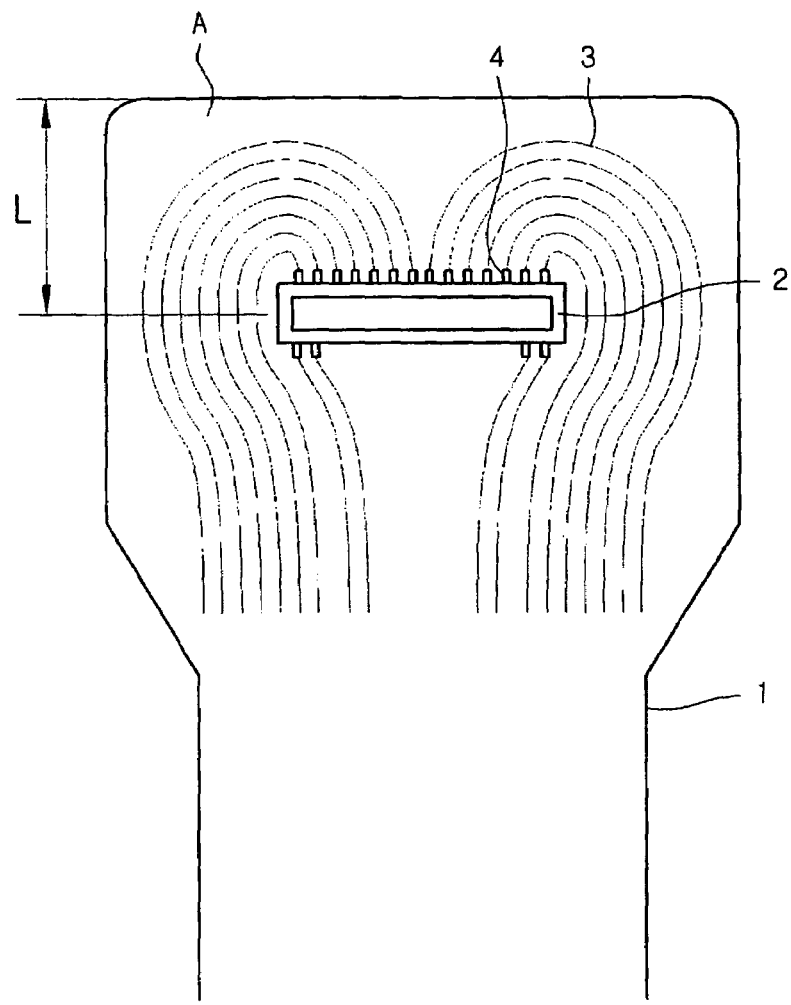
FIG. 1 is a partial front view of a conventional flexible printed circuit board assembly.
Figure 2:
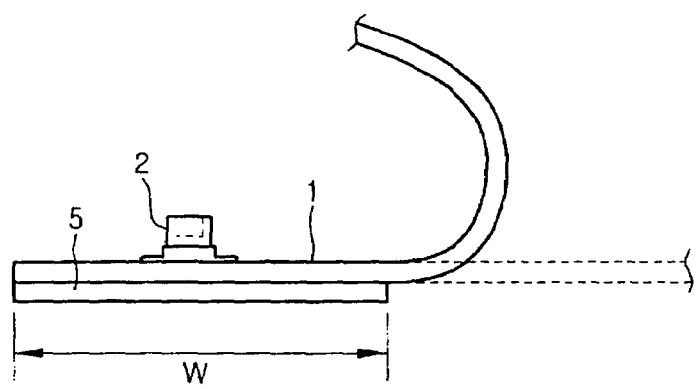
FIG. 2 is a partial side view of the conventional flexible printed circuit board assembly.
Figure 3:
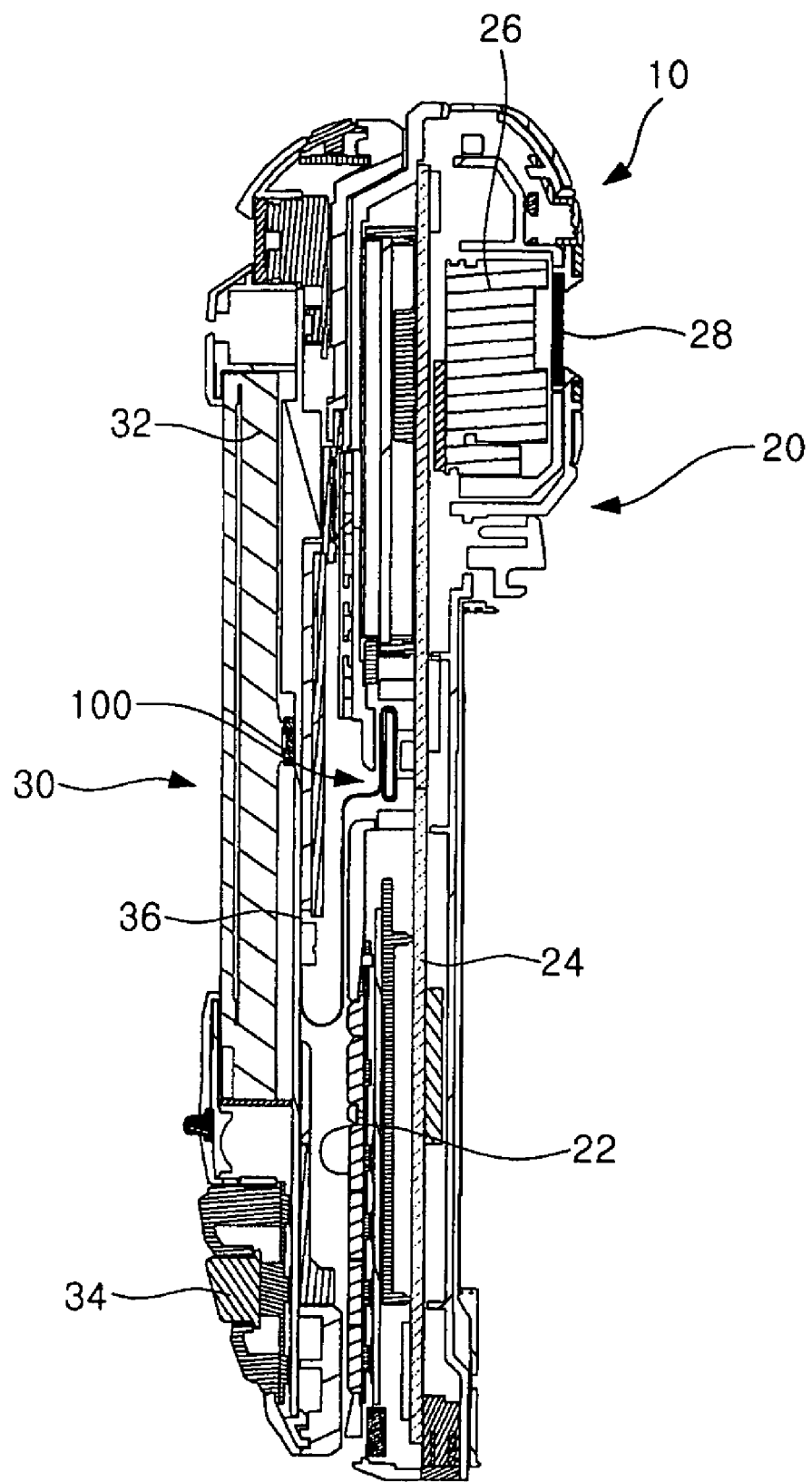
FIG. 3 is a longitudinal sectional view of a portable terminal in which a flexible printed circuit board assembly according to the present invention is mounted.
Figure 4:
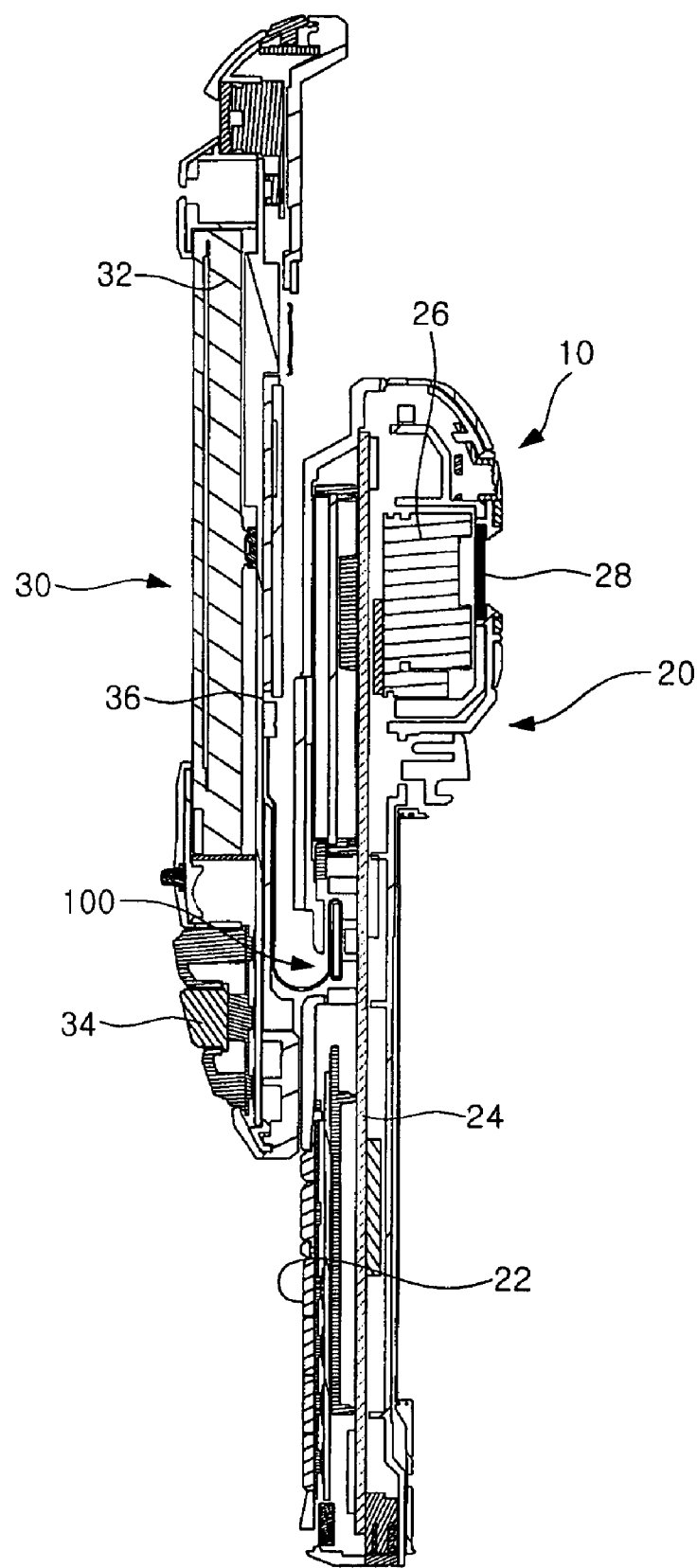
FIG. 4 is a longitudinal sectional view showing a state where a display unit is opened in the portable terminal in which the flexible printed circuit board assembly according to the present invention is mounted.

FIGS. 3 and 4 show a portable terminal to which a flexible printed circuit board assembly according to the present invention is applied. The portable terminal 10 shown in the figures comprises a main body 20 and a display unit 30. The display unit 30 is configured to be slidably opened or closed with respect to the main body.

A button unit 22 including a plurality of buttons pressed by a user is provided on a front surface of the man body 20. The main body 20 contains a main printed circuit board (PCB) 24 for transmitting and receiving certain signals or controlling the displaying status of the display unit 30 in response to a command input through the button unit 22. In case of the portable terminal 10 equipped with the function of a camera, a camera 26 and a lens 28 are installed therein.

A liquid crystal display panel 32, which has a certain size and displays text and images thereon, is provided on a front surface of the display unit 30. A button unit 34 including a plurality of buttons is provided at a side of the front surface of the display unit is 30 so that a user can operate the portable terminal through the button unit without opening the display unit 30. A printed circuit board (PCB) 36 for signal communication is also provided in the display unit 30 so that the printed circuit board 36 can be electrically connected to the printed circuit board 24 contained in the main body 20.

The main PCB 24 contained in the main body 20 and the PCB 36 contained in the display unit 30 are connected to each other by a flexible printed circuit board assembly 100 according to the present invention so that the PCBs can transmit and receive signals. That is, signals are transmitted from the main body 20 to the display unit 30 or from the display unit 30 to the main body 20 through the flexible printed circuit board assembly 100.

Since the flexible printed circuit board assembly 100 can be easily bent due to its flexibility, a signal can be transmitted without damage to the flexible printed circuit board assembly 100 even though the display unit 30 is slidably opened upward.

Figure 5:
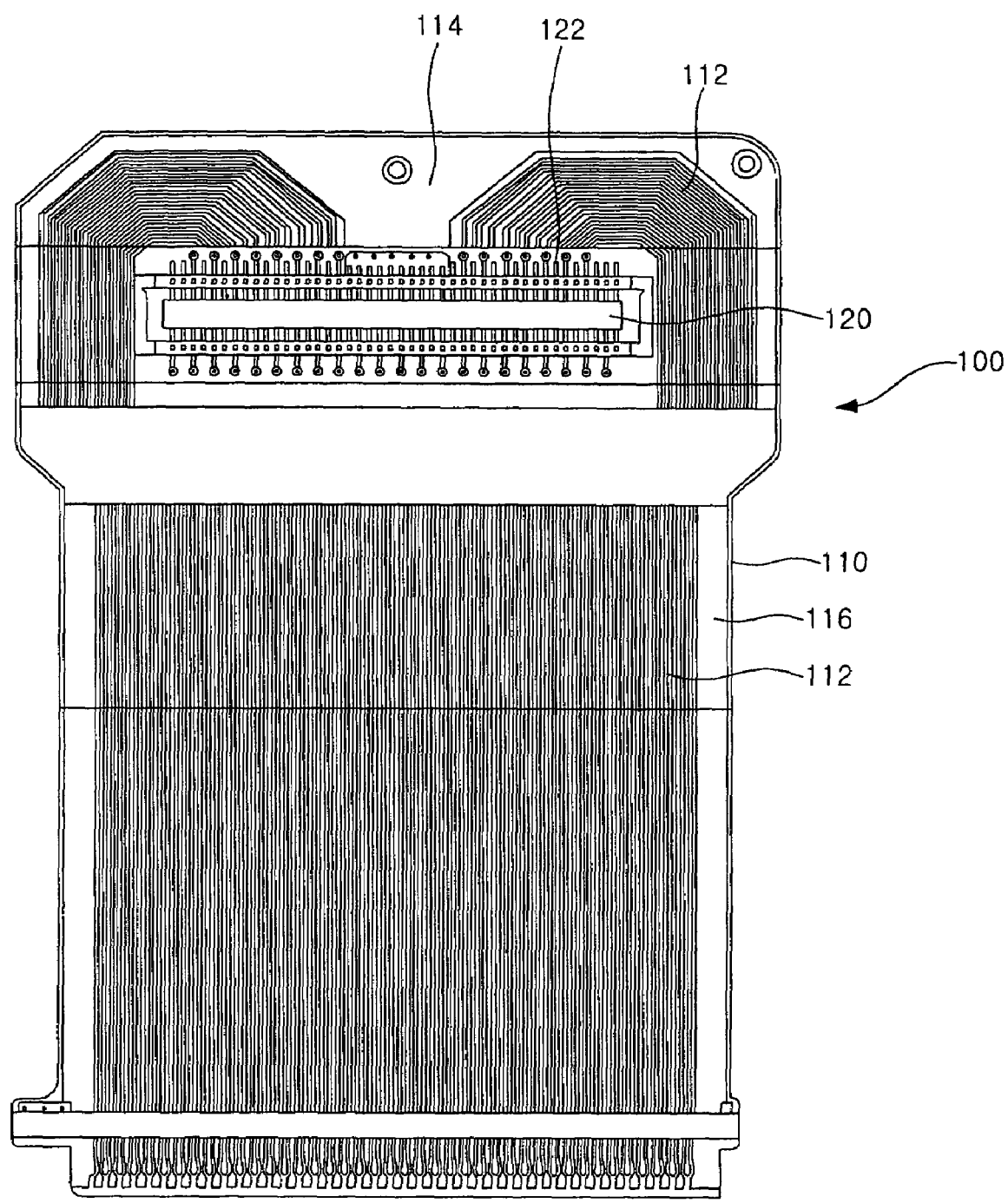
FIG. 5 is a front view of the flexible printed circuit board assembly according to the present invention.
Figure 6:
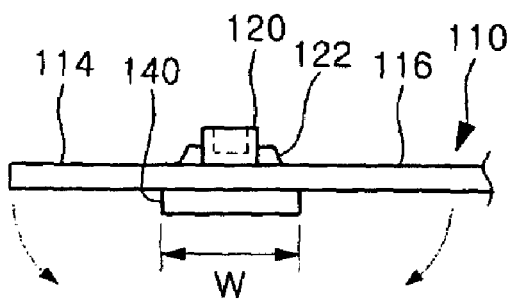
FIG. 6 is a partial side view of the flexible printed circuit board assembly according to the present invention.

Next, the flexible printed circuit board assembly 100 according to the present invention will be described with reference to FIGS. 5 and 6. As shown in the figures, the flexible printed circuit board assembly 100 of the present invention comprises a flexible printed circuit board 110 having certain compliance and a plurality of circuit patterns 112 printed on a surface thereof, and a connector 120 attached to one side of the flexible printed circuit board 110.

The connector 120 is provided in the flexible printed circuit board 110 while being spaced apart by a certain distance from an end (an upper end in FIG. 5) of the flexible printed circuit board 110. In the flexible printed circuit board 110, a portion between the connector 120 and the end of the flexible printed circuit board 110 (an upper portion of the flexible printed circuit board 110 above the connector in FIG. 5) is referred to as "connector outside portion 114" and a portion of the flexible printed circuit board 110 below the connector 120 in FIG. 5 is referred to as "connector inside portion 116".

Since a plurality of terminals 122 are provided at both sides on a bottom surface of the connector 120, circuit patterns to be connected to the plurality of terminals 122 are substantially printed on both the connector outside portion 114 and the connector inside portion 116 with the connector 120 interposed therebetween. The circuit patterns printed on the connector outside portion 114 are mainly formed in a curved shape, and the circuit patterns printed on the connector inside portion 116 are mainly formed in a line shape. The terminals 122 of the connector 120 and the circuit patterns 112 are connected to each other by means of, for example, soldering.

A stiffener 140 is attached to a bottom surface of the flexible printed circuit board 110. The stiffener 140 has rigidity exceeding a certain degree and functions to support the flexible printed circuit board 110. That is, in the case where the terminals 122 of the connector 120 and the circuit patterns 112 of the flexible printed circuit board 110 are connected to each other by means of soldering and the connector 120 is connected to a corresponding connector of a portable terminal, the stiffener 140 is attached to the flexible printed circuit board in order to support and reinforce the flexible printed circuit board 110. The stiffener 140 is preferably made of non-conductive synthetic resin, and is fixed to the bottom surface of the flexible printed circuit board 110 by an adhesive means such as a double-sided tape.

According to the present invention, the stiffener 140 is designed such that a width W thereof in a longitudinal direction of the flexible printed circuit board 110 is slightly larger than that of the connector 120 including the plurality of terminals 122. That is, since the stiffener 140 is to stably support the flexible printed circuit board 110 when the terminals 122 of the connector 120 and the circuit patterns 112 are connected to each other by means of soldering and the connector 120 is connected to a PCB of a main body of a portable terminal, it is sufficient if the stiffener 140 can cover the terminals 122 of the connector 120.

Accordingly, when the stiffener 140 is formed to be slightly larger than the connector 120, the connector outside portion 114 between the connector 120 and the end of the flexible printed circuit board 110 is not substantially supported by the stiffener 140. Therefore, due to the flexibility of the flexible printed circuit board 110 itself, the connector outside portion 114 can be in a bendable state. Further, since the connector inside portion 116 is not supported by the stiffener 140, this portion also has a flexible property as it is. According to the present invention, it can be seen that the flexible printed circuit board assembly is designed such that the connector inside portion 116 as well as the connector outside portion 114 can be bent. Since the flexible printed circuit board assembly 100 of the present invention is designed such that the connector inside portion 116 and the connector outside portion 114 except a portion to which the connector 120 is attached can be bent, the flexible printed circuit board assembly can be mounted in a portable terminal in a state where the portions 114 and 116 are bent. Therefore, an installation space of the flexible printed circuit board assembly can be substantially minimized and the flexible printed circuit board assembly can be easily applied to a portable terminal which becomes slimmer and smaller.

Figure 7:
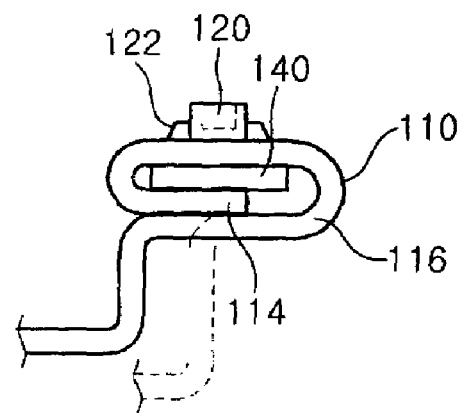
FIG. 7 is a side view showing an assembled state of the flexible printed circuit board assembly according to the present invention.

FIG. 7 shows a state where the flexible printed circuit board assembly 100 of the present invention constructed as above can be actually mounted in a device such as a portable terminal. First of all, the connector outside portion 114 is bent with respect to the connector 120 and then attached to a bottom surface of the stiffener 140. The connector outside portion 114 may be bonded to the bottom surface of the stiffener 140 by means of an adhesive or a double-sided tape. Next, the connector inside portion 116 is bent downward and then attached to the bottom surface of the stiffener 140. As a result, the connector inside portion 116 is bonded to the connector outside portion 114. An adhesive, a double-sided tape or the like may be used to bond the connector inside portion 116 to a bottom surface of the connector outside portion 114.

In this state, the connector inside portion 116 can be bent again at a position where a bonded portion thereof to the connector outside portion 114 is terminated. FIG. 7 shows this state. Here, the bonded portion (bonded length) between the connector inside portion 116 and the connector outside portion 114 should be determined according to the installation location of the flexible printed circuit board assembly 100 in a device such as a portable terminal to which the flexible printed circuit board assembly 100 is applied.

Through these processes, assembling preparation for the flexible printed circuit board assembly 100 of the present invention can be completed. The fact that the portion of the flexible printed circuit board 110 around the connector 120 can be folded in the flexible printed circuit board assembly 100 means that it is possible to remarkably reduce a space required for actually mounting the flexible printed circuit board assembly and to sufficiently apply the flexible printed circuit board assembly to a smaller and slimmer portable terminal even though the number of the circuit patterns 112 is substantially increased due to diversification of its functions and the size of the connector 120 is increased accordingly.

Figure 8:
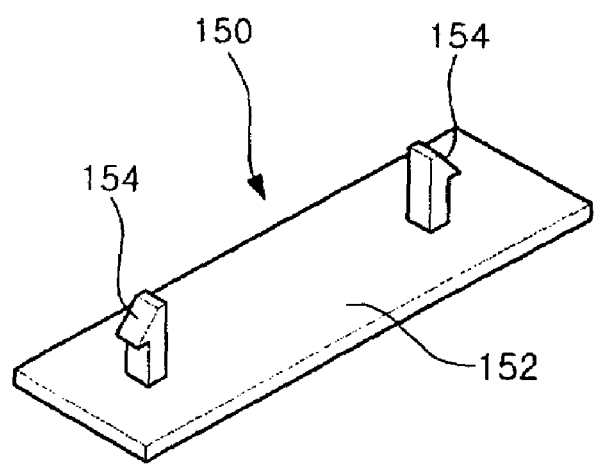
FIG. 8 is a perspective view of another example of a stiffener used in the flexible printed circuit board assembly according to the present invention.
Figure 9:
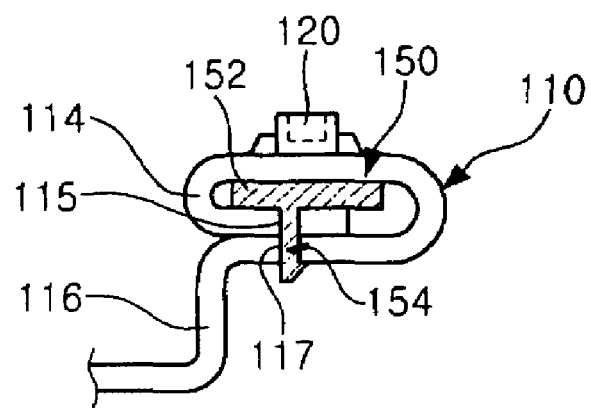
FIG. 9 is a side view showing a used state of the flexible printed circuit board assembly employing the stiffener shown in FIG. 8.

Next, another example of the stiffener in the present invention will be described with reference to FIGS. 8 and 9. In the description of this example, the description will be made while the components of the flexible printed circuit board 110 and the connector 120 are designated by the same reference numerals as the previous example. As shown in the figures, a stiffener 150 of this example comprises an attaching plate portion 152 to be attached to a bottom surface of the flexible printed circuit board 110, and hooks 154 extending downward from the attaching plate portion 152. The hooks 154 are provided to maintain a state where the connector inside portion 116 and the connector outside portion 114 of the flexible printed circuit board 110 are coupled to the attaching plate portion 152. It can be seen that the stiffener 150 of this example is provided with a pair of hooks 154.

In the stiffener 150 of this example constructed as above, the attaching plate portion 152 is attached to the bottom surface of the flexible printed circuit board 110 on which the connector 120 is mounted. In this state, the hooks 154 extend downward as shown in FIG. 9. In such a state, the connector outside portion 114 of the flexible printed circuit board 110 is bent to come into close contact with the attaching plate portion 152 of the stiffener 150. Fastening holes 115 are formed in regions on the connector outside portion 114 corresponding to the locations of the hooks 154. Once the hooks 154 are inserted into the fastening holes 115, the connector outside portion 114 can be fastened to the hooks 154. Further, fastening holes 117 are formed in regions on the connector inside portion 116 corresponding to the locations of the hooks 154. In such a state, once the connector inside portion 116 is bent again toward the bottom surface of the attaching plate portion 152 and the hooks 154 then pass through the fastening holes 117 of the connector inside portion 116, the connector inside portion 116 can be supported by the hooks 154 without being arbitrarily separated from the connector outside portion 114.

In this example, it can be seen that the hooks 154 of the stiffener 150 maintains the coupled state between the connector inside portion 116 and the connector outside portion 114 of the flexible printed circuit board 110. Accordingly, even in this example, it can be seen that peripheral portions of the flexible printed circuit board 110, i.e., the connector inside portion 116 and the connector outside portion 114, except a portion on which the connector 120 is mounted are bent toward the bottom surface of the stiffener 150 and maintained in this state by the hooks, and that the installation state of the flexible printed circuit board 110, which is substantially equal to that in the first example described above, is provided.

Since the connector inside portion 116 and the connector outside portion 114 are maintained in the bent state by the hooks 154 in this example, there is an advantage in that there is no need for attaching these portions to the bottom surface of the stiffener 150.

As described above, it can be seen that a basic subject matter of the present invention is to construct the flexible printed circuit board 110 having the connector such that the connector inside portion and the connector outside portion can be bent by mounting the stiffener only on a portion of flexible printed circuit board corresponding to the connector. Further, it can be seen that a space required for mounting the flexible printed circuit board assembly can be substantially reduced by bending the connector inside portion 116 and the connector outside portion 114 of the flexible printed circuit board 110 and subsequently bonding them to the bottom surface of the stiffener or supporting them by means of the hooks.

According to the present invention described above, the entire volume of the flexible printed circuit board assembly itself can be substantially minimized even though circuit patterns become complicated due to a recent tendency of diversification of functions of a portable terminal or the like and the size of a connector is increased accordingly. It can be seen that the flexible printed circuit board assembly of the present invention can be sufficiently mounted in a relatively small mounting space. Therefore, the flexible printed circuit board assembly of the present invention can be adapted to a tendency of miniaturization and slimness of a device such as a portable terminal in which the flexible printed circuit board assembly will be mounted.

What is claimed is:

1. A flexible printed circuit board assembly, comprising:
a flexible printed circuit board having a plurality of circuit patterns and an end;
a connector mounted on a top surface of the flexible printed circuit board so that the connector is spaced apart from the end of the flexible printed circuit board and electrically connected to the circuit patterns; and
a stiffener attached to a region on a bottom surface of the flexible printed circuit board below the connector and having a size corresponding to that of the connector,
wherein a connector outside portion of the flexible printed circuit board comprises a portion of the flexible printed circuit board located between the end of the flexible printed circuit board and the connector, and a connector inside portion comprises a portion of the flexible printed circuit board located on the opposite side of the connector from the connector outside portion, and at least one of the connector outside portion and the connector inside portion is bent around the stiffener so that the stiffener is located between at least one of the connector inside portion and the connector outside portion of the flexible printed circuit board and the connector.

2. The flexible printed circuit board assembly as claimed in claim 1, wherein the connector outside portion is bent and bonded to a bottom surface of the stiffener.

3. The flexible printed circuit board assembly as claimed in claim 1, wherein the connector inside portion is bent and bonded to a bottom surface of the stiffener.

4. The flexible printed circuit board assembly as claimed in claim 1, wherein the connector outside portion is bent and bonded to a bottom surface of the stiffener, and the connector inside portion is bent and bonded to a bottom surface of the connector outside portion.

5. The flexible printed circuit board assembly as claimed in claim 1, wherein one of the connector inside portion and the connector outside portion is bent and bonded to a bottom surface of the stiffener and the other is bent and bonded to a bottom surface of the one bonded to the bottom surface of the stiffener.

6. The flexible printed circuit board assembly as claimed in any one of claims 1 to 5, wherein at least one of the connector inside portion and the connector outside portion bonded by means of a double-sided tape.

7. The flexible printed circuit board assembly as claimed in claim 1, wherein the stiffener is formed of a non-conductive synthetic resin material.

8. The flexible printed circuit board assembly as claimed in claim 1, wherein the stiffener has a bottom surface provided with a downward extending hook, and the connector inside portion and the connector outside portion are provided with fastening holes so that the hook can be fastened to the holes after the connector outside portion and the connector outside portion are bent downward.

9. A flexible printed circuit board assembly, comprising:
a flexible printed circuit board having a plurality of circuit patterns and an end;
a connector mounted on a top surface of the flexible printed circuit board so that the connector is spaced apart from the end of the flexible printed circuit board and electrically connected to the circuit patterns; and
a stiffener attached to a region on a bottom surface of the flexible printed circuit board below the connector and having a size corresponding to that of the connector,
wherein a connector outside portion of the flexible printed circuit board comprises a portion of the flexible printed circuit board located between the end of the flexible printed circuit board and the connector, and a connector inside portion comprises a portion of the flexible printed circuit board located on the opposite side of the connector from the connector outside portion, and the connector outside portion and the connector inside portion are bent around the stiffener so that the stiffener is located between the connector inside portion and the connector outside portion of the flexible printed circuit board and the connector.

10. A method for manufacturing a flexible printed circuit board assembly, comprising the steps of:
forming a plurality of circuit patterns on a flexible printed circuit board;
mounting a connector in a region on a top surface of the flexible printed circuit board;
electrically connecting the circuit patterns to the connector;
attaching a stiffener to a region on a bottom surface of the flexible printed circuit board corresponding to the connector;
bending downward a connector outside portion of the flexible printed circuit board located between an end of the flexible printed circuit board and the connector, and fixing the connector outside portion to a bottom surface of the stiffener; and
bending downward a connector inside portion of the flexible printed circuit board located adjacent to a side of the connector opposite to a side of the connector that is adjacent the connector outside portion of the flexible printed circuit board and, and fixing the connector inside portion to a bottom surface of the connector outside portion.

11. The method as claimed in claim 10, wherein the connector inside portion or the connector outside portion is fixed by means of bonding.

* * * * *